United States Patent
Downes (10) Patent No.: US 6,483,041 B1
(45) Date of Patent: Nov. 19, 2002

(54) MICRO SOLDERED CONNECTION

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/438,245

(22) Filed: Nov. 12, 1999

(51) Int. Cl.$^7$ ................................................. H05K 1/16
(52) U.S. Cl. .................... 174/260; 228/180.1; 361/773; 174/263
(58) Field of Search ................................ 174/262, 263, 174/264, 265, 266; 257/698; 228/179.1, 180.1; 361/773

(56) References Cited

U.S. PATENT DOCUMENTS

| | | | | |
|---|---|---|---|---|
| 4,877,176 A | * | 10/1989 | Kubis ....................... | 228/173.5 |
| 5,619,018 A | * | 4/1997 | Rossi ......................... | 174/261 |
| 5,671,125 A | * | 9/1997 | Russell et al. .............. | 361/760 |
| 6,137,064 A | * | 10/2000 | Kiani et al. ................. | 174/266 |

* cited by examiner

*Primary Examiner*—Kamand Cuneo
(74) *Attorney, Agent, or Firm*—Chaplin & Huang, L.L.C.; David E. Huang, Esq.

(57) ABSTRACT

The invention is directed to techniques for forming a soldered connection using a pin having a channel. The channel enables the pin to form a secure connection with a via (e.g., by facilitating gas percolation out of the via hole during soldering to improve solder flow, by holding solder prior to pin insertion and soldering, or by facilitating accurate pin bending to hold solder or a pin insert prior to pin insertion and soldering) to improve connection system reliability and increase manufacturing yields. In one arrangement, the pin has a surface which includes (i) a first surface area, (ii) a second surface area that is substantially parallel to the first surface area, and (iii) a channel surface area which defines a channel that extends from the first surface area toward the second surface area. To form a soldered connection, the pin is inserted into a cavity defined by a via of a connecting member (e.g., a circuit board), in a direction that is parallel to a central axis of the via. The pin is then soldered to the via to establish an electrical pathway between the pin and the via. Depending on the particular arrangement, the channel generally facilitates the introduction of solder into the cavity of the via. Accordingly, the cavity dimension of the via can be smaller than that required for vias of a conventional reflow soldering approach (i.e., less than 100% of the maximum pin cross-section as for a conventional reflow soldering approach). Hence, the invention is suitable for use in high-density, micro-soldered connection arrangements (e.g., in situations with vias closer together than in the conventional reflow soldering approach).

20 Claims, 9 Drawing Sheets

MICRO SOLDERED CONNECTION

BACKGROUND OF THE INVENTION

Some connection systems between electronic components such as printed circuit boards (PCBs), backplanes, cables, integrated circuits (ICs), IC connectors and the like, use metal pins and metallic, plated-through cylinders called vias. Often, such a system includes one electronic component which has a set of metal pins and another component which has a corresponding set of vias. In general, the component with the pins includes a housing which positions the pins such that the pins extend from the housing in a grid-like manner (e.g., in rows and columns). Similarly, the component with the vias typically arranges the vias in a complementary manner such that holes of the vias align with ends of the pins when the two components are brought into alignment with one another.

In general, to connect the two components, the housing of the pin-providing component is positioned relative to the via-providing component such that the end of each pin properly aligns with a corresponding via hole. Then, the housing of the pin-providing component and the via-providing component are brought together so that the metal pins evenly insert into the via holes. There are different conventional approaches to making sure that the connections between the pins and the vias are secure.

One conventional approach is called "reflow soldering" or the "wave soldering". In this approach, wave soldering machinery typically solders the pins and vias together once the pins have been inserted into the vias. In general, molten solder flows through the remaining voids between the pins and the vias to form electrical pathways for carrying signals between the pins and the vias.

Typically, the reflow approach uses a grid pattern pitch of approximately 0.100 of an inch or 0.100" (often pronounced "100 mils"). That is, the pins are arranged generally in rows and columns such that the center axis of each pin is approximately 0.100" away from the center axes of pins in adjacent rows and columns. Similarly, the vias typically are arranged in complementary rows and columns such that the center axis of each via is approximately 0.100" away from the center axes of vias in adjacent rows and columns.

For the reflow soldering approach, the diameters of the holes of the vias typically are 100% larger than the maximum cross-sectional dimension of the pins in order to promote solder flow within the vias once the pins have been inserted. For example, for a round pin having a maximum diameter of 0.030", the inner diameter of the via hole is generally 0.060".

In general, pins having a square cross-section, which are stamped from flat metal stock, are also suitable for use in the reflow soldering approach. Such square cross-sectioned shaped pins generally are less expensive than pins having a circular cross-section or pins with rounded corners since the square cross-sectioned pins typically do not need to undergo a tumbling, coining or turning process to round the corners of the pins. Rather, the pin manufacture can simply cut/punch/stamp the square cross-sectioned pins from a sheet of metal stock. Accordingly, the thickness of each pin is essentially the width of the metal stock. Although flat pins are less expensive than rounded pins, better soldering results typically are obtained with pins having circular cross-sections or rounded corners than with pins having a square or rectangular cross-section and sharp corners.

Another approach to forming secure connections is the "intrusive reflow soldering" approach. In this approach, automated equipment typically provides portions of solder and flux for each pin/via combination prior to insertion of the pins into the via holes. Often, the equipment partially inserts these solder portions (sometimes in the form of a paste and sometimes as solder pre-forms assembled to the pin base) into the via holes of a component prior to pin insertion. Then, the equipment brings the pin-providing component and the via-providing component together by inserting the pins of the pin-providing component into the via holes of the via-providing component. The equipment then provides heat to melt the solder portions and additional solder to fill any remaining voids between the pins and the vias.

Typically, the grid pattern for the intrusive reflow approach has a pitch that is similar to that used in the reflow soldering approach (i.e., 0.100"), or a finer pitch in the range of 0.080" to 0.100". Furthermore, for the intrusive reflow soldering approach, the diameters of the vias holes typically are not 100% larger than the maximum cross-sectional dimension of the pins, as in the reflow soldering approach. Rather, the via holes for the intrusive reflow approach generally can be 25% larger than the maximum cross-sectional dimension of the pins for sufficient solder distribution since pre-placement of the solder portions facilitates solder delivery into the via holes.

For the intrusive reflow soldering approach, as in the reflow soldering approach, square or round cross-sectioned pins are generally preferred. Pins having a round cross-section are ideally suited for intrusive reflow soldering. Pins having a square cross-section are generally suitable but require more solder. Pins having a rectangular (but non-square) cross-section typically are not used in the reflow soldering approach since such pins provide little or no additional benefit over pins having a square cross-section.

Another approach to forming secure connections between two components is called the "compression fit" approach. This approach is also known as the "compliant fit"or the "eye-of-the-needle" approach. In this approach, no solder is used. Rather, each pin typically is flat (i.e., each pin has a square or rectangular cross-section) and has a hole (or eye) stamped through it (i.e., the "eye-of-the-needle") allowing the pin to compress when inserted into a via to form a secure connection. In particular, each pin has a cross-sectional diameter that is sized to be larger than the cross-section diameter of its corresponding via hole to provide an interference fit when inserted into that via hole. Accordingly, when the pins are inserted into the holes of the vias, the pins compress to fit within the via holes and apply pressure against the inner metallic surfaces of the vias (e.g., copper-plated surfaces). As a result, the connections formed between the pins and vias are secure.

Typically, the compression fit approach uses a finer grid pattern pitch than either the reflow soldering approach or the intrusive reflow soldering approach. One example of a pitch that is suitable for the compression fit approach is an 0.080" by 0.060" grid. Connection systems which used grids of this size are often called "high-density" due to the large number of connections (i.e., pin/via connections) that can be formed in such a small area.

Typically, pins which have a rectangular or even square cross-section are used in the compression fit approach. The range for a typical width for a rectangular pin suitable for use in the compression fit approach is 0.012" to 0.015". The range for a typical pin length is 0.026" to 0.028". The sides of the compression-fit pin typically are allowed to vary by 0.002" in either direction. A particular characteristic of compression fit pins is their central portions which have a bulging shape. That is, the shape of the eye and the pin material around the eye is designed to provide a particular form factor, and a particular size reduction when inserted into a via.

SUMMARY OF THE INVENTION

Unfortunately, there are disadvantages to the conventional reflow soldering, compression fit and intrusive reflow soldering approaches. For example, the conventional reflow soldering approach generally is not used in high-density connection applications (e.g., in connection arrangements having rows and columns less than 0.100" apart) for several reasons. In particular, reflow soldering connection systems are susceptible to tail shorts, i.e., shorts formed by excess solder hanging from pin ends extending from adjacent via holes. Additionally, the via holes are typically sized to be 100% larger than the maximum pin diameters to promote solder flow within the via holes. This size restriction imposes a limit on how small the grid pattern pitch of the connection system can be before significantly increasing the likelihood of forming unwanted shorts between adjacent vias. Moreover, any reduction in the size of the via would tend to hinder solder flow around the standard reflow soldering pins thus creating excessive voids within the via holes which would pose manufacturing yield difficulties and product reliability issues. Furthermore, in a high-density configuration, solder, which occasionally flows or "wicks up" the lengths of the pins and flows out the ends of the via holes closest to the housing (e.g., a connector body) holding the pins, would be more likely to cause shorts directly beneath the housing. Such shorts may be hidden by the housing and inaccessible for detection and/or repair.

The compression fit approach suffers from manufacturing yield and reliability drawbacks as well. In particular, formation of high-density connections between compression fit pins and vias typically require high insertion forces (particularly compared to low or zero insertion force situations for reflow soldering pins and vias). Accordingly, a small abnormality (e.g., a bend or irregular shape which places a pin or via slightly out of tolerance) can cause the pin to collapse or bend improperly, or cause the via to distort. As a result, the electrical connection, if made at all, will likely be unreliable.

The intrusive reflow soldering approach also suffers from certain drawbacks. In particular, this approach is complex and expensive to implement. In particular, specialized procedures, equipment and soldering materials are required to pre-position solder at the via holes prior to pin insertion, insert the pins and then apply heat and additional solder to form secure connections between components. Some component manufacturers have been known to prefer the reflow soldering approach or the compression fit approach over the intrusive reflow soldering approach due to the added complexity and expense which typically characterizes the intrusive reflow soldering approach.

In contrast to the above-described conventional approaches, the invention is directed to techniques for forming a soldered connection using a pin having a channel. The channel enables the pin to form a secure connection with a via (e.g., by facilitating gas percolation out of the via hole during soldering to improve solder flow, by holding solder prior to pin insertion and soldering, or by facilitating accurate pin bending to hold solder or a pin insert member prior to pin insertion and soldering) to improve connection system reliability and increase manufacturing yields.

In one arrangement, the pin has a surface which includes (i) a first surface area, (ii) a second surface area that is substantially parallel to the first surface area, and (iii) a channel surface area which defines a channel that extends from the first surface area toward the second surface area. To form a soldered connection, the pin is inserted into a cavity defined by a via of a connecting member (e.g., a circuit board), in a direction that is parallel to a central axis of the via. The pin is then soldered to the via to establish an electrical pathway between the pin and the via. Depending on the particular arrangement (as will be explained in further detail below), the channel generally facilitates the introduction of solder into the cavity of the via. Accordingly, the cavity dimension of the via can be smaller than that required for vias of the conventional reflow soldering approach (i.e., less than 100% of the maximum pin cross-section as is typically required for the conventional reflow soldering approach). Hence, the invention is suitable for use in high-density, micro-soldered connection arrangements (e.g., in situations with vias closer together than in the conventional reflow soldering approach).

In one arrangement, the channel is a tunnel that extends from a first plane defined by the first surface area to a second plane defined by the second surface area through the pin. In this arrangement, the channel allows gas within the via hole to escape out of the remaining voids within the via cavity during soldering. Preferably, the pin is located relative to the via such that a portion of the channel extends outside the cavity defined by the via to facilitate gas percolation even when solder has almost filled the via cavity. Additionally, the channel provides additional surface area for drawing solder. In a preferred arrangement, a solder-stop member is placed around the pin such that a first portion of the channel extends on a first side of the solder-stop member and a second portion of the channel extend on a second side of the solder-stop member that is opposite the first side. Such an arrangement helps block solder such that it is less likely to escape out of the via cavity while continuing to enable gas to escape through the channel.

In this arrangement, the presence of the channel promotes solder flow within the via cavity to the extent that the via cavity can be made narrow (e.g., less than 100% of the maximum pin diameter as is typically used in a conventional reflow soldering approach). Accordingly, the via can be positioned closer to other neighboring vias in a high-density connection arrangement. Hence, the benefits of forming a soldered connection (e.g., high reliability and improved manufacturing yields) can be derived in a high-density, micro-soldered configuration.

In the above-described arrangement, the channel preferably extends along a central axis of the pin to facilitate gas percolation and to promote solder flow. In one arrangement, the channel extends all the way to the end of the pin to form a solder flow path. That is, the channel includes a gap at the end of the pin. Such a gap facilitates entry of the solder into the via cavity (and particularly the channel) during soldering.

In one arrangement, a portion of solder can be positioned within the channel prior to soldering. Accordingly, less solder is required to flow into the via hole during soldering. Preferably, the solder is fitted within the channel (e.g., by automated equipment) such that (i) a first portion of the piece of solder extends from the channel of the pin in a first direction, and (ii) a second portion of the piece of the solder extends from the channel of the pin in a second direction that is opposite the first direction. Preferably, the first and second portions are substantially the same amounts. Any amounts that interfere with pin insertion can be shaped prior to insertion to provide a minimal or zero insertion force fit.

In another arrangement, the first surface area defines a first plane, the second surface area defines a second plane that is parallel to the first plane, and the channel extends from the first plane toward the second plane to enable machinery (e.g., automated equipment) to bend the pin along the channel prior to insertion of the pin into the via hole. In this arrangement, the channel preferably forms a groove along one of the sides of the pin to facilitate accurate and controlled bending of the pin along the channel since no material needs to be displaced in the channel region during bending.

In one arrangement, the pin further includes multiple tab portions which bend around a pin insert member when the pin is bent. The multiple tab portions of the pin hold the pin insert member in place during soldering. The pin insert member is preferably metallic and contributes both structural strength and electrical conductivity to the connection formed between the pin and the via.

In another arrangement, the channel is a groove or slot which divides the pin into a first pin portion and a second pin portion. In this arrangement, the first and second pin portions are bent relative to each other such that the first and second pin portions hold a piece of solder for soldering. Accordingly, the piece of solder enters the via hole prior to soldering and less solder is required to flow into the via hole during soldering. Preferably, the surface of the pin further includes a first side-channel surface area that defines a first side-channel (in addition to the grooved-channel), and a second side-channel surface area that defines a second side-channel. In this arrangement, the first and second side-channels are essentially holes which extend along a direction that is parallel to the central axis of the via. Accordingly, gas can percolate out of the via hole through these multiple side-channels during soldering.

Preferably, the pin has a cross-section that is less than or equal to a cross-section of the cavity defined by the via. Accordingly, insertion of pin into the via hole requires little or no insertion force (e.g., "a zero insertion force connection system"). This arrangement reduces the likelihood of bending the pin or distorting the via during pin insertion.

In the above-described arrangements of the invention, it should be understood that there is no restriction on the shape of the pin or its channel (as there is in the compression fit approach where a compression fit pin is designed to provide a particular cross-sectional reduction during insertion into a via). Accordingly, the top portion of the pin (or neck), which is adjacent the housing holding the pin, can be made thicker than compression fit pins to further prevent pin bending during pin insertion.

The features of the invention, as described above, may be employed in electronic systems and related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The invention is directed to techniques for forming a soldered connection using a pin having a channel. The channel enables the pin to form a secure connection with a via (e.g., by facilitating gas percolation out of the via hole during soldering to improve solder flow, by holding solder prior to pin insertion and soldering, or by facilitating accurate pin bending to hold solder or a pin insert member prior to pin insertion and soldering) to improve connection system reliability and increase manufacturing yields. Such techniques are suitable for use in soldered connection arrangements such as micro-soldered connection situations, i.e., high-density, soldered connection configurations. The techniques of the invention may be employed in electronic systems and other related devices such as those manufactured by EMC Corporation of Hopkinton, Mass.

Figure 1:
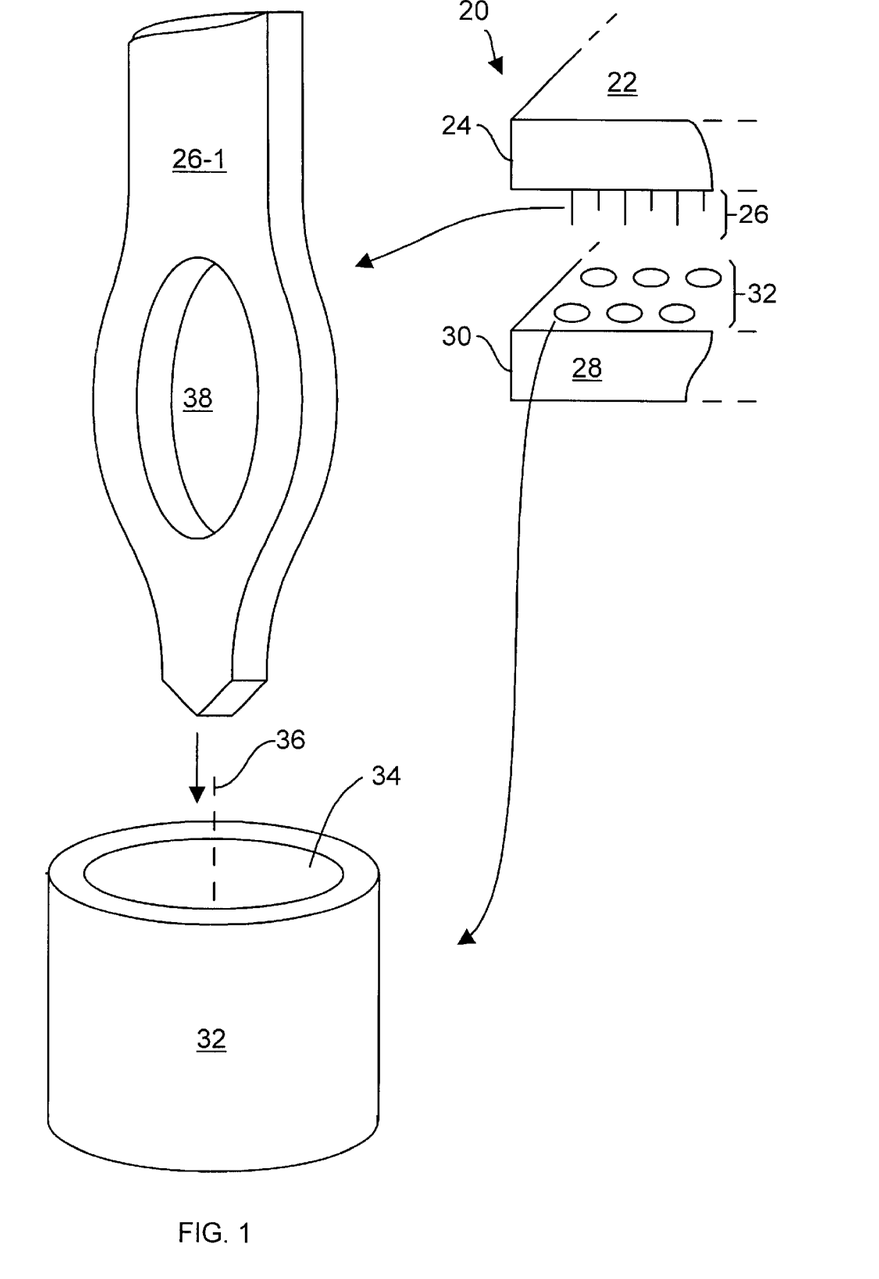
FIG. 1 shows perspective view of a connecting system and a detailed view of a pin and a via which are suitable for use by the connecting system.

FIG. 1 shows a perspective view of a connection system 20 which is suitable for use by the invention. The connection system 20 includes a first connecting member 22 having, among other things, a housing 24 and a set of pins 26. The connection system 20 further includes a second connecting member 28 having, among other things, a housing 30 and a set of metal-plated vias 32 supported by the housing 30. By way of example, the first connecting member 22 can be a connector which belongs to an electronic device such as a disk drive, and the second connecting member can be an electronic component such as a printed circuit board (PCB).

FIG. 1 further shows an expanded perspective view of a via 32 and a pin 26-1, which is suitable for use as one of the pins 26 of the first connecting member 22. The pin 26-1 inserts within a cavity 34 defined by the via 32, along a central axis 36 of the via 32. The pin 26-1 includes a channel 38, at least a portion of which resides within the cavity 34 when the pin 26-1 is inserted into the via 32.

Figure 2A:
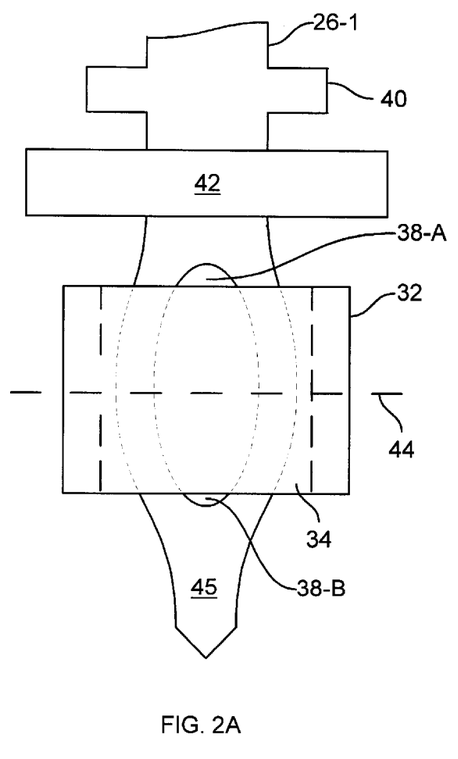
FIG. 2A shows a side view of the pin and the via of FIG. 1 when the pin is inserted into the via.

FIG. 2A shows a side view of the pin 26-1 when the pin 26-1 is inserted within the cavity 34 of the via 32. End portions 38-A and 38-B of the channel 38 preferably extend outside the via cavity 34 when the pin 26-1 is placed in its final position within the via 32 prior to soldering. Preferably, the pin 26-1 further includes multiple tabs 40 and a solder-stop member 42 (i.e., an anti-wicking component such as kapton) which is held in place by the tabs 40. That is, the tabs 40 prevent the solder-stop member 42 from moving further up the pin 26-1 when the pin is inserted into the via 32.

Once the pin 32 is properly positioned within the via 32, solder is provided to secure the pin 26-1 and the via 32 together. In the arrangement illustrated in FIG. 2A, the solder preferably is introduced at the pin end 45 (e.g., near the channel portion 38-B) using a conventional reflow soldering or wave soldering process. As the solder is applied, the channel 38 (i) allows gas to escape from the via cavity 34 and (ii) draws the solder further up the pin 26-1. As the solder flows through the via cavity 34 toward the channel portion 38-A, gas (e.g., air) escapes from the cavity 34 through the channel 38. Although the entire channel portion 38 can be filled with solder, this is not required. The solder-stop member 42 prevents excessive amounts of solder from escaping and causing a short with any adjacent conductive materials (e.g., solder of an adjacent pin/via connection).

Figure 2B:
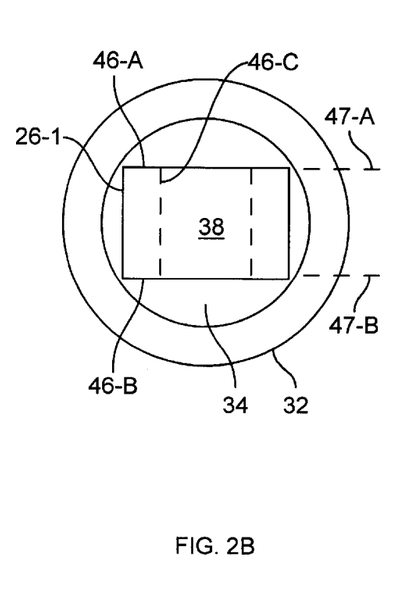
FIG. 2B shows a cross-sectional view of the pin and the via of FIG. 2A.

FIG. 2B shows a cross-sectional view of the pin 26-1 and the via 32 along a plane 44 of FIG. 2A. As shown in FIG. 2B, the pin 26-1 has a rectangular shaped cross section. Preferably, the corners of the pin 26-1 do not extend beyond the confines of the via cavity 34 into the via surface (e.g., a copper-plated surface). Rather, the pin 26-1 is preferably sized to match or be slightly smaller than the confines of the via cavity 34 to require little or no insertion force (e.g., "zero insertion force").

As shown in FIG. 2B, the pin 26-1 includes a surface 46 having a first surface area 46-A which defines a first plane 47-A, a second surface area 46-B which defines a second plane 47-B that is parallel to the first plane 47-A. That is, the first plane 47-A defined by the first surface area 46-A is everywhere substantially equidistant from the second plane 47-B defined by the second surface area 46-B. Furthermore, the surface 46 includes a channel surface area 46-C which defines the channel 38 that extends from the first surface area 46-A to the second surface area 46-B, through the pin 26-1.

It should be understood that a difference between the pin 26-1 and a conventional compression fit pin is that the channel shape and dimensions of the channel 38 and the pin 26-1 are unrelated to any compression reduction requirement, while the shape and dimensions of an eye of a compression-fit pin and the conventional compression-fit pin itself are designed to provide a particular form factor for compression within a via.

It should be further understood that the presence of the channel 38 promotes solder flow within the via cavity 34 to the extent that the via cavity 34 can be made narrow (e.g., less than 100% of the maximum pin diameter as is typically used in a conventional reflow soldering approach). Accordingly, the via 32 can be positioned closer to other neighboring vias (e.g., see FIG. 1) in a high-density connection arrangement. Hence, the benefits of forming a soldered connection (e.g., high reliability and improved manufacturing yields) can be derived in a high-density, micro-soldered configuration.

Figure 3A:
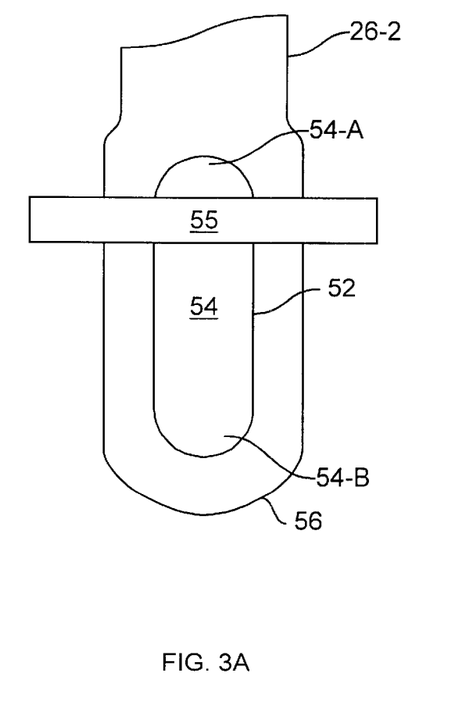
FIG. 3A shows a side view of a pin with a rounded end which is suitable for use by the connecting system of FIG. 1.

FIG. 3A shows a pin 26-2 having certain geometries that are different than the pin 26-1, which is also suitable for use by the invention. The pin 26-2 includes, among other things, a channel surface area 52 which defines a channel 54. The channel 54 allows gas to escape from the via cavity 34 and draws solder through the via cavity 34 (see FIG. 1) in a manner similar to that of the channel 38 of the pin 26-1. Optionally, a solder-stop member 55 is positioned along the pin 26-2 to divide the channel 54 into a first channel portion 54-A and a second channel portion 54-B. The solder-stop member 55 substantially blocks solder but allows gas to pass from the channel portion 54-B to the channel portion 54-A.

As shown in FIG. 3A, the pin 26-2 further includes a rounded end 56 which is somewhat different than the pointed end of the pin 26-1. The rounded end 56 of pin 26-2 reduces the amount of solder which collects at the end of the via 32 after soldering thus reducing the likelihood of tail shorts, i.e., shorts between solder portions extending from the ends of the vias 32 or pins 26.

Figure 3B:
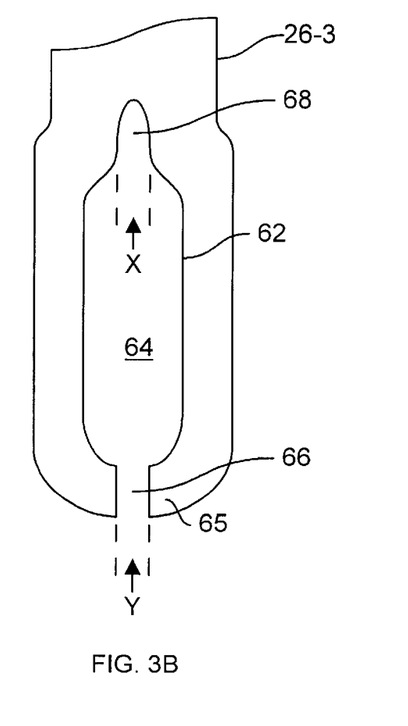
FIG. 3B shows a side view of a pin with an opened end and a channel that extends to an end of the pin, in an arrangement which is suitable for use by the connecting system of FIG. 1.

FIG. 3B shows another pin 26-3 which is suitable for use by the invention. The pin 26-3 includes a channel surface 62 which defines a channel 64 within the pin 26-3. In particular, the surface 62 defines a gap 66 at the pin end and a notched region 68. The gap 66 operates as a solder flow path to facilitate solder flow into the channel 64. The notched region 68 prevents cracking or channel shape distortion when the pin is inserted into the via 32. Preferably, the gap 66 has a width Y of substantially 0.005". Furthermore, the notched region 68 preferably has a width X of substantially 0.005". The pin 26-3 can include a solder-stop member (not shown) similar to that shown for the other pins 26-1 and 26-2.

Again, it should be understood that the channels 54 and 64 shown in FIGS. 3A and 3B facilitate solder flow within the via cavity 34. Accordingly, the via 32 can be positioned closer to other neighboring vias 32 in a high-density connection arrangement. As a result, the arrangement of pins 26-2, 26-3 and vias 32 are suitable for use in a high-density, micro-soldered configuration.

Figure 4A:
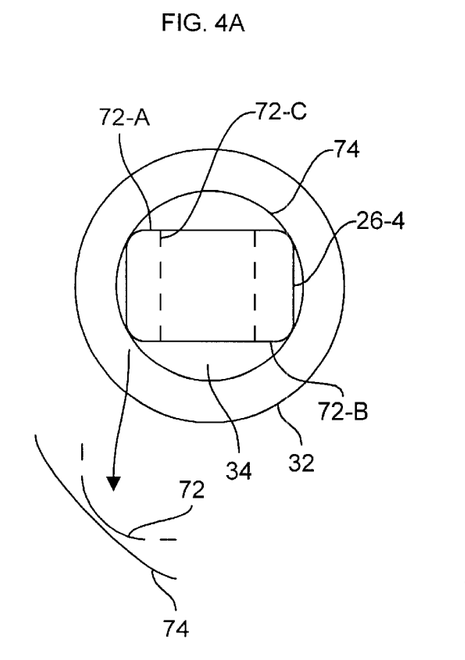
FIG. 4A shows a side view of a pin having rounded corners which is suitable for use by the connecting system of FIG. 1.

FIG. 4A shows a cross-sectional view of a pin 26-4 which is suitable for use by the invention. As shown, the pin 26-4 has a surface 72 which includes a first surface area 72-A and a second surface area 72-B which are parallel to each other. The surface 72 further includes a channel surface area 72-C which defines a channel within the pin 26-4 (see dashed lines). Preferably, the defined channel of pin 26-4 is similar in shape to one of the above-described channels 38, 54 and 64 (see FIGS. 1, 2A, 3A and 3B). The surface 72 further defines rounded edges (see expanded view in FIG. 4A) to decrease the likelihood of causing damage when inserted into the via cavity 34 and to promote better solder flow within the via cavity 34. In particular, the rounded edges are less likely to scrape against the inner surface 74 of the via 34 and are thus less likely to damage the metallic-plating of the via 32 or bend due to forces placed on the edges of the pin 26-4.

Figure 4B:
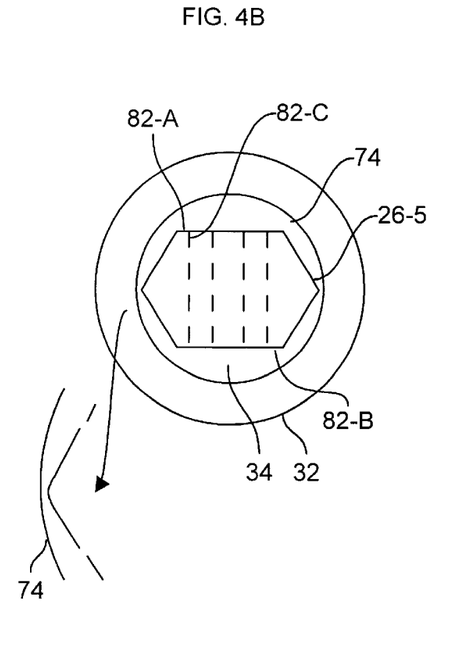
FIG. 4B shows a side view of a pin with tapered sides which is suitable for use by the connecting system of FIG. 1.

FIG. 4B shows a cross-sectional view of a pin 26-5 which is suitable for use by the invention. The pin 26-5 has a surface 82 which includes a first surface area 82-A and a second surface area 82-B which are parallel to each other. The surface 82 further includes a channel surface area 82-C (see outer dashed lines) within the pin 26-5. This channel preferably has a shape which is similar to one of the above-described channels 38, 54 and 64 (see FIGS. 1, 2A, 3A and 3B). The surface 82 further defines a hexagonal cross-sectional shape for the pin 26-5 which provides multiple edges for contacting the surface 74 of the via 32 (see expanded view in FIG. 4B). These edges are preferably rounded to improve solder flow within the via cavity 34.

It should be understood that the pins 26-4 and 26-5 can include a shape similar to the side views shown for the other pins 26-1, 26-2 and 26-3 as shown FIGS. 1, 2A, 3A and 3B. For example, the channel surface area 82 of pin 26-5 (see FIG. 4B) may define both a main channel and a narrower flow path (as shown by the two sets of dashed lines through the pin 26-5 of FIG. 4B) which are similarly shown for the pin 26-3 of FIG. 3B.

Figure 5A:
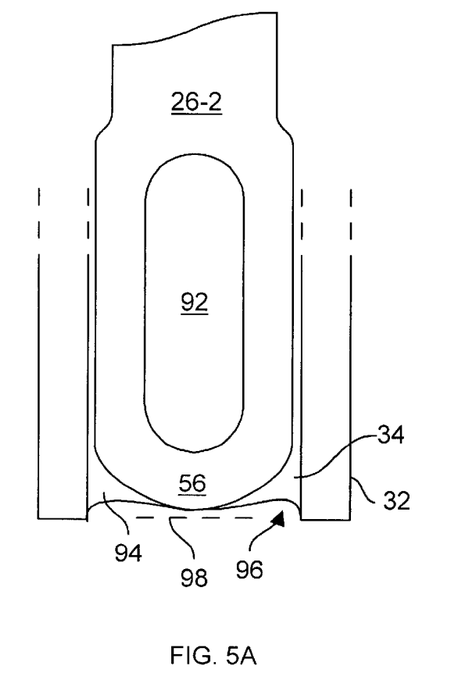
FIG. 5A shows a side view of the pin having the rounded end of FIG. 3A when the pin is soldered within a via.

FIG. 5A shows a soldering arrangement which is suitable for use by the invention. In this arrangement, the pin 26-2 of FIG. 3A is inserted into the via 32 such that the rounded end 56 of the pin 26-2 does not extend out of the via cavity 34, i.e., the rounded end 56 does not pass the plane 98 defined by the outer edge of the via 32. Accordingly, solder 94 can form a secure connection between the pin 26-2 and the via 32 without extending out of the via cavity 34 as well. In particular, in this arrangement, the solder 94 forms a concave well 96 rather than a tail which would otherwise increase the likelihood of a tail-short.

A similar soldering arrangement to that shown in FIG. 5A can be provided for some of the other above-described pins 26. In particular, the FIG. 5A arrangement can be used for the pin 26-3 (see FIG. 3B) and the pins 26-4 (FIG. 4A) and 26-5 (FIG. 4B) provided that they have rounded ends similar to that of pins 26-2 and 26-3.

Figure 5B:
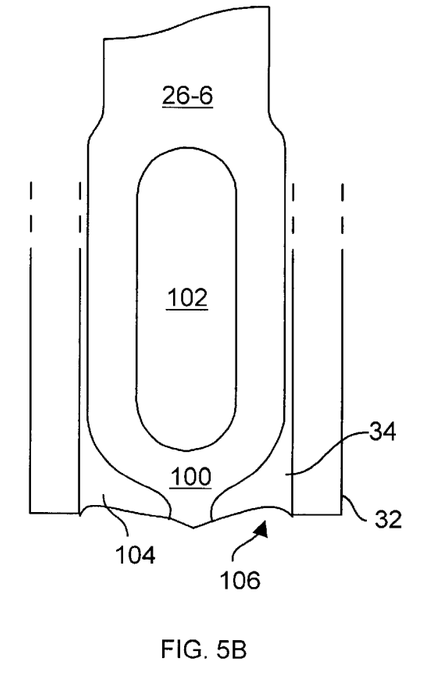
FIG. 5B shows a side view of a pin (i) having a pointed end and (ii) which is soldered within a via, which is suitable for use by the connecting system of FIG. 1.

FIG. 5B shows a soldering arrangement which is suitable for use by the invention. This arrangement uses a pin 26-6 having a pointed end 100 which is similar to the end 45 of the pin 26-1 (see FIG. 2A). However, the end 100 of the pin 26-6 is shorter than the end 45 of the pin 26-1 and does not extend substantially out of the via cavity 34 of the via 32, if at all. The end 100 facilitates the initial wicking or drawing of solder into the via cavity 34. The end 100 of the pin 26-6 has a rounder shape than the end 45 of the pin 26-1 thus enabling the solder 104 to form a concave well 106 similar to the concave well 96 for the arrangement of FIG. 5A. A benefit of such a well is a reduced likelihood of tail-shorts relative to arrangements with larger amounts of pin material and/or solder extending from the via cavity 34.

Figure 6:
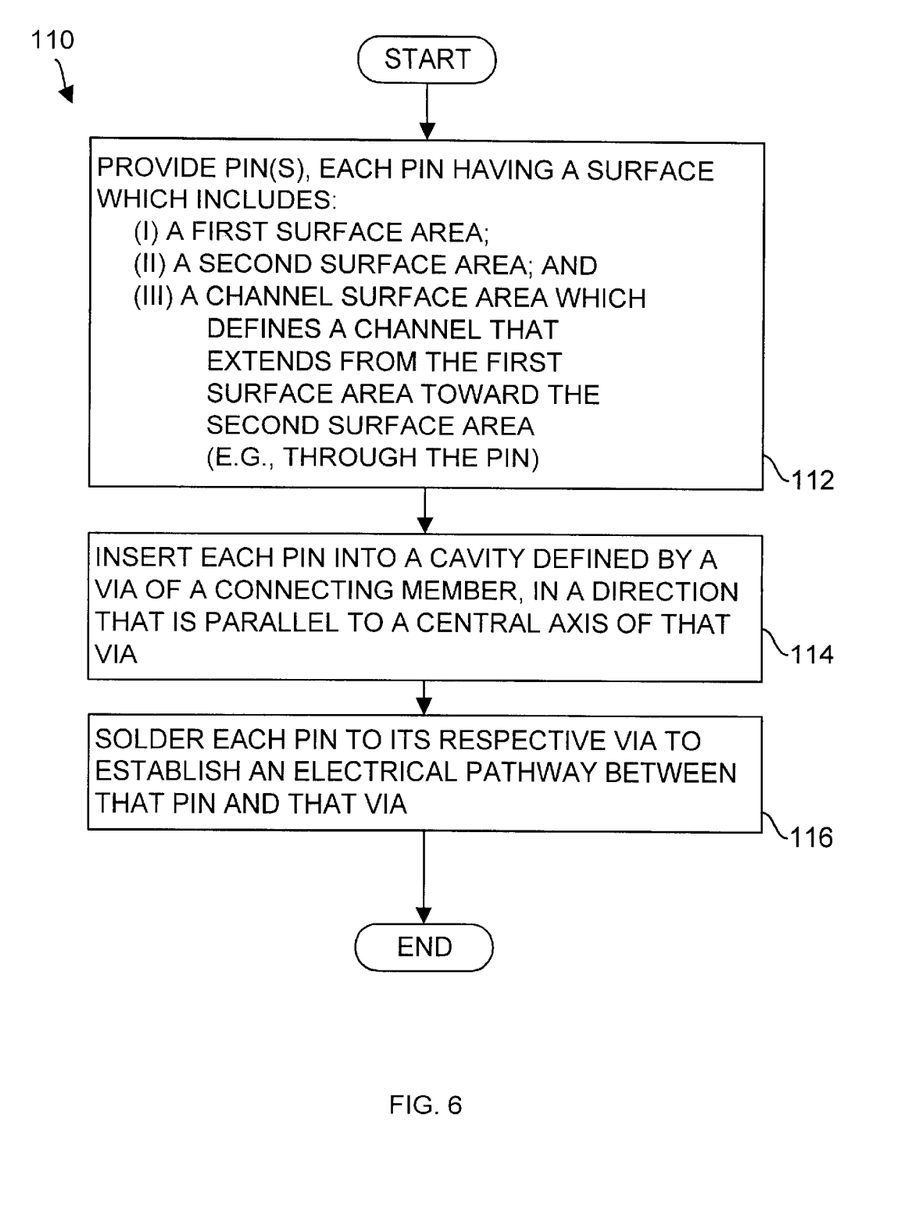
FIG. 6 shows a flow chart of a procedure for forming a soldered connection in accordance with the invention.

FIG. 6 shows a flow chart of a procedure 110 which is suitable for forming a solder connection between the first and second connecting members 22, 28 of the connection system 20 (also see FIG. 1). Preferably, an assembly line of automated equipment performs the procedure 110 on two electronic components such as the connecting members 22, 28 shown in FIG. 1. In such an arrangement, the equipment preferably performs the procedure 110 on each of the pin/via pairs concurrently using reflow soldering techniques.

In step 112, the automated equipment provides a first connecting member (e.g., a first component) having at least one pin 26. The pin has a surface including a first surface area, a second surface area, and a channel surface area defining a channel that extends from the first surface area toward the second surface area. For example, as shown in FIG. 2B, the pin 26-1 has a first surface area 46-A, a second surface area 46-B, and a channel surface area 46-C defining a channel 38 that extends from the first surface area 46-A toward the second surface area 46-B.

In step 114, the automated equipment inserts the pin 26 into a cavity defined by a via 32 of another connecting member (e.g., another component) in a direction that is parallel to a central axis of the via. For example, as shown in FIG. 1, the equipment brings the connecting members 22 and 28 together (see FIG. 1) such that the pins 26 insert into the vias 32 along a direction that is parallel to the central axes of the vias 32 (also see central axis 36 of the via 32 in the expanded view of FIG. 1).

In step 116, the automated equipment (e.g., wave soldering machinery) solders each pin 26 to its respective via 32 to establish an electrical pathway between that pin 26 and that via 32. For example, each pin 26 is soldered to the via in the manner shown in FIG. 5A or FIG. 5B using a reflow soldering process.

Figure 7A:
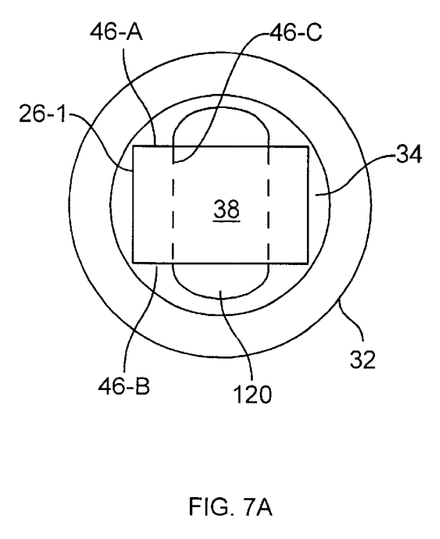
FIG. 7A shows a cross-sectional view of the pin of FIG. 1 with a piece of solder inserted within channel of the pin prior to soldering.

In accordance with some arrangements of the invention, the automated equipment introduces solder to the cavity 34 of the via 32 prior to final reflow soldering, i.e., prior to steps 114 and 116 of FIG. 6, as will now be described with reference to FIGS. 7A, 7B, 8A, 8B and 8C. In one arrangement, as shown in FIG. 7A, the automated equipment inserts a portion of solder 120 into the channel 38 of the pin 26-1. Subsequently, the automated equipment inserts the pin 26-1 and solder portion 120 into the via 32, and solders the pin 26-1 and the via 32 together. During soldering, the solder portion 120 combines with additionally provided solder to form a secure electrical pathway between the pin 26-1 and the via 32. The presence of the solder portion 120 alleviates the need for the automated equipment to provide a large amount of solder during the soldering step (see step 116 of FIG. 6) and promotes better solder distribution within the via cavity 34. Hence, there is less gas required to percolate out of the via cavity 34 during soldering, and less likelihood of excessive solderless voids within the via cavity 34.

It should be understood that the solder portion 120 can be positioned within the channel 38 of the pin 26-1 with precision when using automated equipment. For example, such a procedure can be performed in an assembly line when providing large numbers of the pins 26-1 with solder portions 120 within respective channels 38.

It should be further understood that the solder portions 120 can be provided to pins 26 from a dispenser which may not provide the solder portions such that amounts extending from each end of the channels 38 are substantially equal. Rather, the amount extending from one end of the channel 38 can be greater than the amount extending from another end. In such a situation, the amounts can be shaped to ensure proper transition fitting into the via cavities 34 of the vias 32.

Figure 7B:
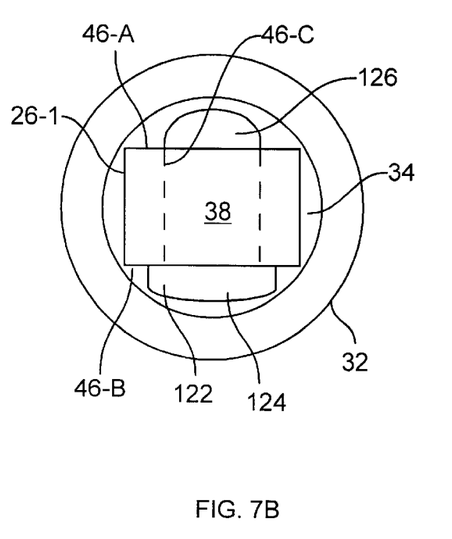
FIG. 7B shows a cross-sectional view of the pin of FIG. 1 with a piece of solder inserted within a channel of the pin and with different amounts of solder extending from each opening of the channel prior to soldering.

For example, as shown in FIG. 7B, a solder portion 122 includes a first amount 124 extending from one end of the channel 38 of the pin 26-1, and a second amount 126 extending from another end of the channel 38. The first amount 124 is substantially greater than the second amount 126 as shown in FIG. 7B, and may require reshaping by the automated equipment prior to insertion into the via cavity 34.

Figure 8A:
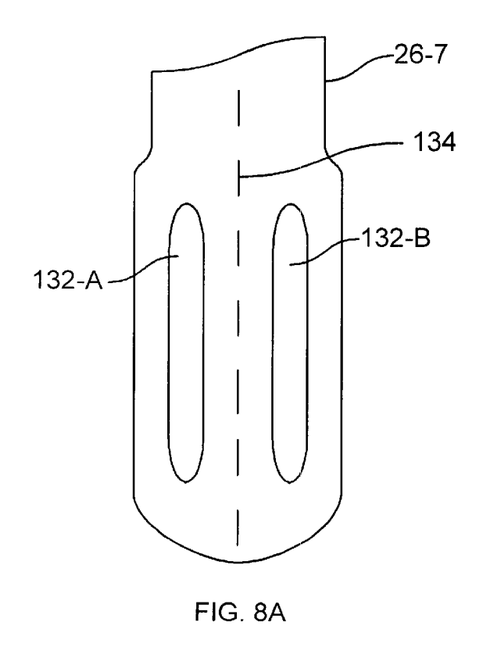
FIG. 8A shows a side view of a pin with multiple channels, one being a grooved channel and two others extending through the pin, which is suitable for use by the connecting system FIG. 1.

FIG. 8A shows a pin 26-7 that is suitable for use by the invention. The pin 26-7 includes a channel 134 that extends along a central axis of the pin 26-7, in a groove-like manner. The pin 26-7 further includes multiple side-channels 132, namely, side-channels 132-A and 132-B which extend in a parallel manner along channel 134, as illustrated in FIG. 8A. That is, the cross-sections of the side-channels 132 stretch out, in an elongated manner, parallel to the channel 134.

Figure 8B:
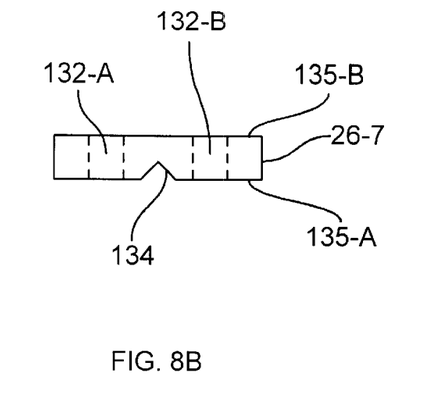
FIG. 8B shows a cross-sectional view of the pin of FIG. 8A.

FIG. 8B shows a cross-sectional view of the pin 26-7. As shown, the channel 134 extends from one flat surface area 135-A of the pin 26-7 toward another flat surface area 135-B, which is parallel to the flat surface area 135-A. That is, the grooved channel 134 travels inwardly into the pin 26-7 from one flat side of the pin 26-7 toward the other flat side, but does not extend all the way through the pin 26-7. Furthermore, each channel 132-A, 132-B extends from the surface area 135-A to the surface area 135-B, through the pin 26-7.

Preferably, automated equipment provides the channel 134 within the pin 26-7 by stamping the pin 26-7. The presence of the channel 134 facilitates subsequent accurate and controlled bending of the pin 26-7 by the automated equipment.

Figure 8C:
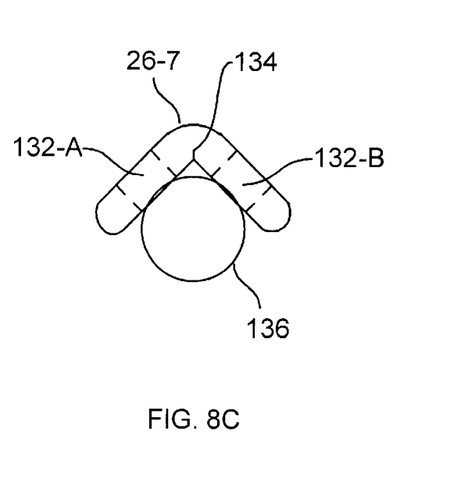
FIG. 8C shows a cross-sectional view of the pin of FIG. 8B when the pin has been bent around a piece of solder.

FIG. 8C shows a cross-sectional view of the 26-7 after the pin 26-7 has been bent around a portion of solder 136, and prior to insertion of the pin 26-7 into a via 32. As shown in FIG. 8C, the channel 134 facilitates bending of the pin 26-7. In particular, the channel 134 provides a thin area of the pin 26-7 around which to bend the pin 26-7, and is shaped in a groove-like manner such that substantial pin material does not need to be displaced to form the bend. The multiple side-channels 132 facilitate holding of the solder portion 136 in place. As with the arrangement shown in FIGS. 7A and 7B, the presence of the solder 136 within the via cavity 34 (e.g., see FIG. 1) during soldering alleviates the need to provide a larger amount of solder into the cavity 34.

The bending of the pin 26-7 into the arrangement shown in FIG. 8C improves the strength and rigidity of the pin 26-7. In particular, the bent pin 26-7 is stronger in the Z-direction and less likely to bend inadvertently during handling (e.g., during insertion of the pin 26-7 within the via 32). Furthermore, the bent pin 26-7 is more accurately formed for its X and Y true positions, i.e., the bent pin 26-7 is more stable relative to the X-Y grid. Accordingly, the bent pin 26-7 is stronger along all three axes, and is less likely to bend in an unintended manner.

It should be understood that the presence of channels 38, 134 and solder portions 120, 122 and 136 (see FIGS. 7A, 7B, 8A, 8B and 8C) facilitate filling of the via cavity 34 with solder to provide a secure connection between the pin 26 and the via 32. This allows the via 32 to be made narrow. Accordingly, the via 32 can be positioned closer to other neighboring vias 32 in a high-density connection arrangement. Therefore, the arrangement of pins 26 and vias 32 are suitable for use in a high-density, micro-soldered configuration.

Figure 9A:
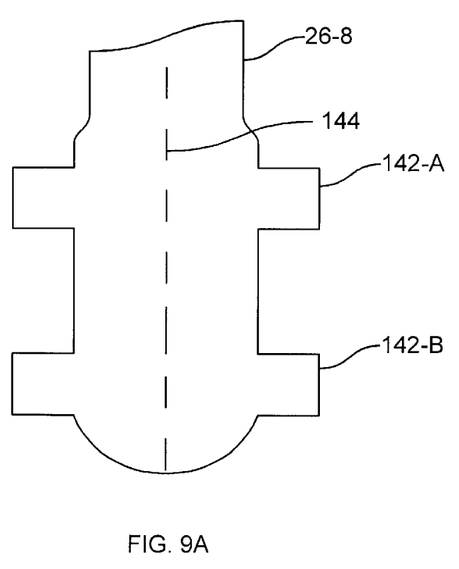
FIG. 9A shows a side view of a pin with a grooved channel and tabs which is suitable for use by the connecting system of FIG. 1.
Figure 9B:
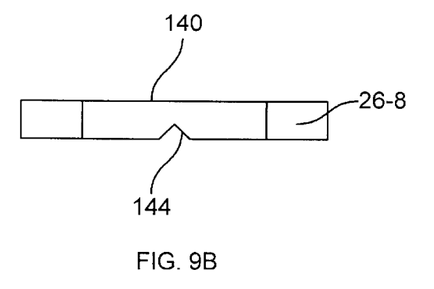
FIG. 9B shows a cross-sectional view of the pin of FIG. 9A.
Figure 9C:
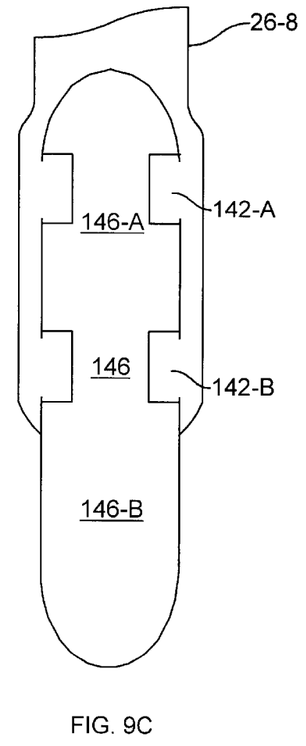
FIG. 9C shows a side view of the pin of FIG. 9A when the pin has been bent around a pin insert.
Figure 9D:
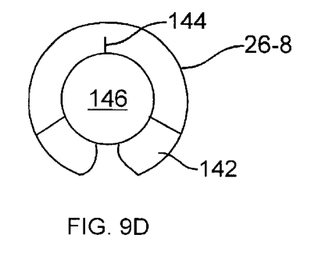
FIG. 9D shows a cross-sectional view of the pin of FIG. 9C.

FIG. 9A shows a pin 26-8 which is suitable for use by the invention. As shown in FIG. 9A, the pin 26-8 includes a channel 144 along a central axis, and multiple tabs 142 (e.g., see labeled tabs 142-A and 142-B). A cross-sectional view of the pin 26-8 is shown in FIG. 9B. The channel 144 is similar to the channel 134 of the pin 26-7 in that it is essentially a groove or slot shaped indentation (e.g., made by stamping the shape using automated machinery) which extends into the pin 26-7 but not all the way through the pin 26-7. The channel 144 facilitates bending of the pin 26-8 as shown in FIGS. 9C and 9D. In particular, the pin 26-8 bends around a pin insert member 146 (e.g., steel or copper) at the channel 144, and the tabs 142 hold the pin insert 146 in place. Preferably, the pin 26-8 holds the pin insert member 146 at one end 146-A, and allows another end to extend freely 146-B. The end 146-B is eventually inserted into a via cavity 34 of a via 32 (see FIG. 1), and the pin 26-8 with the pin insert 146 are soldered to the via 32. A cross-sectional view of the pin/insert arrangement of FIG. 9C is shown in FIG. 9D. The presence of the pin insert 146 provides added structural strength and electrical conductivity to the connection between the pin 26-8 and the via 32.

The above-described arrangements provide secure connections between a pin 26 and a via 32. The presence of the channel in each arrangement leads to easier solder flow within the via cavity 34 to the extent that the via cavity can be made narrow (e.g., less than 100% of the maximum pin diameter as is typically used in a conventional reflow soldering approach). As such, the via 32 can be positioned closer to other neighboring vias 32 in a high-density connection arrangement. Thus, the benefits of forming a soldered connection (e.g., high reliability and improved manufacturing yields) can be derived in a high-density, micro-soldered configuration. The features of the invention may be particularly useful in computerized devices manufactured by EMC Corporation of Hopkinton, Mass.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the geometry of a pin 26 of the connection system 20 is independent of any compression fit requirement since the pin 26 does not require compression when inserted within the via 32. Accordingly, other shapes (e.g., ovals, circles, rectangles and parabolic shapes) can be used for the outer contours of the pins 26, and the channels (e.g., channel 38) of the pins 26. Preferably, the outer contour of the pin 26 facilitates insertion of the pin 26 into a via cavity 34 without damaging either the via 32 or the pin 26. Furthermore, the shape of the channel 38 preferably enables gas percolation and promotes solder flow during soldering of the pin 26 to the via 32.

Additionally, it should be understood that material other than kapton is suitable for use as the solder-stop member 42 (see FIG. 2A). Preferably, such material has a low affinity for solder to prevent excess solder from escaping from the via cavity 34 and collecting at the top of the via 32 during soldering in order to prevent solder shorts.

Furthermore, it should be understood that the pin 26 and the via 32 preferably form a "zero insertion" force connection system 20. However, an alternative arrangement is to have the pin 26 slightly larger than the via cavity 34 such that more than minimal insertion force is required. In such an arrangement, some compression of the pin 26 and some distortion of the via 32 would take place, but such mechanical interference would not create a permanent and reliable gas-tight connection without the addition of solder.

Additionally, it should be understood that the above-described connections are preferably formed with the assistance of automated machinery. Although it is possible for some steps to be performed by humans, the use of automated equipment enables substantially higher economies of scale with consistent quality and reliability.

Furthermore, it should be understood that features of one pin can be incorporated into another pin to form a hybridized pin having combinations of benefits of the various above-described features. For example, the pin 26-2 may further includes tabs such as the tabs 40 of pin 26-1 to prevent the solder-stop member 55 from moving further up the pin 26-2 to an area where it can no longer effectively prevent excess solder from escaping from the via 32. Such combinations of pin features are intended to be within the scope of the invention.

What is claimed is:

1. A connection system, comprising:
   a first connecting member having a via that defines a cavity;
   a second connecting member having a housing, and a pin attached to the housing, the pin extending within the cavity of the via along a direction that is substantially parallel to a central axis of the via, the pin including a surface having:
   a first surface area,
   a second surface area that is substantially parallel to the first surface area, and
   a channel surface area which defines a channel that extends from the first surface area toward the second surface area; and
   solder attached to the pin and the via to establish an electrical pathway between the pin and the via.

2. The connection system of claim 1 wherein the first surface area defines a first plane, wherein the second surface area defines a second plane that is parallel to the first plane, and wherein the channel extends from the first plane to the second plane through the pin.

3. The connection system of claim 2 wherein the via is a plated through-hole configured to carry a single signal.

4. The connection system of claim 2 wherein the channel extends substantially along a central axis of the pin.

5. The connection system of claim 4 wherein the channel extends through an end of the pin to form a solder flow path.

6. The connection system of claim 4 wherein the via is a plated through-hole configured to carry a single signal.

7. The connection system of claim 2 wherein a portion of the channel extends outside the cavity defined by the via to enable gas to escape from the channel when the pin and the via are soldered together.

8. The connection system of claim 7 further comprising:
   a solder-stop member attached around a portion the pin such that a first portion of the channel extends on a first side of the solder-stop member and a second portion of the channel extends on a second side of the solder-stop member that is opposite the first side.

9. The connection system of claim 7 wherein the via is a plated through-hole configured to carry a single signal.

10. The connection system of claim 1 herein the pin has a cross-section that is less than or equal to a cross-section of the cavity defined by via.

11. The connection system of claim 10 wherein the via is a plated through-hole configured to carry a single signal.

12. The connection system of claim 1 wherein the channel surface area defines a channel that extends completely from the first surface area to the second surface area, and wherein the channel is disposed along the central axis of the via.

13. The connection system of claim 12 wherein the via is a plated through-hole configured to carry a single signal.

14. The connection system of claim 1 wherein a cross-section of the pin, which is substantially perpendicular to the central axis of the via, is substantially rectangular in shape.

15. The connection system of claim 14 wherein the via is a plated through-hole configured to carry a single signal.

16. The connection system of claim 1 wherein a cross-section of the pin, which is substantially parallel to the central axis of the via, is substantially oval in shape.

17. The connection system of claim 16 wherein the via is a plated through-hole configured to carry a single signal.

18. The connection system of claim 1 wherein the via is a plated through-hole configured to carry a single signal.

19. The connection system of claim 1 wherein the channel extends from the first surface area to the second surface area through the pin, and wherein the surface of the pin further includes;
   another channel surface area that defines another channel that extends from the first surface area to the second surface area through the pin.

20. The connection system of claim 1 wherein the pin further includes multiple tab portions, and wherein connecting system further comprises:
   an insert member that is held, within the cavity defined by the via, by the multiple tab portions of the pin.

* * * * *